US010545546B2

(12) United States Patent
Varadarajan et al.

(10) Patent No.: US 10,545,546 B2
(45) Date of Patent: Jan. 28, 2020

(54) REVERSIBLE DIRECTION THERMAL COOLING SYSTEM

(71) Applicant: Intel Corporation, Santa Clara, CA (US)

(72) Inventors: Krishnakumar Varadarajan, Bangalore (IN); Mark Angus MacDonald, Beaverton, OR (US); Srinivasarao Konakalla, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/904,291

(22) Filed: Feb. 23, 2018

(65) Prior Publication Data
US 2019/0041924 A1    Feb. 7, 2019

(51) Int. Cl.
    *G06F 1/20*    (2006.01)
    *G06F 1/3203*    (2019.01)
    (Continued)

(52) U.S. Cl.
CPC .............. *G06F 1/206* (2013.01); *F25B 25/00* (2013.01); *F25B 27/00* (2013.01); *G06F 1/3203* (2013.01);
(Continued)

(58) Field of Classification Search
CPC ........... H05K 7/20145; H05K 7/20209; H05K 7/20727; H05K 7/20909; H05K 7/20718;
(Continued)

(56) References Cited

U.S. PATENT DOCUMENTS

| 579,081 A | 3/1897 | Rembert |
|---|---|---|
| 2,831,630 A | 4/1958 | John |

(Continued)

FOREIGN PATENT DOCUMENTS

| JP | S61048999 | 4/1986 |
|---|---|---|
| JP | H1054388 A | 2/1998 |

(Continued)

OTHER PUBLICATIONS

International Search Report and Written Opinion received for PCT Patent Application No. PCT/US2014/043786, dated Oct. 17, 2014, 11 pages.
(Continued)

*Primary Examiner* — Dion Ferguson
*Assistant Examiner* — Amir A Jalali
(74) *Attorney, Agent, or Firm* — Patent Capital Group

(57) ABSTRACT

Particular embodiments described herein provide for an electronic device that can be configured to receive data related to thermal properties of a first heat source, activate an air mover based on the received data related to the thermal properties of the first heat source, where a majority of the air moved by the air mover is biased in a first direction, determine that the majority of the air should have a bias in a second direction, and reverse a direction of rotation of the air mover to cause the air moved by the air mover to have a bias in the second direction. In an example, the first direction towards the first heat source and the second direction is opposite the first direction and towards a second heat source.

25 Claims, 8 Drawing Sheets

(51) Int. Cl.
   *F25B 25/00* (2006.01)
   *F25B 27/00* (2006.01)
   *H05K 7/20* (2006.01)

(52) U.S. Cl.
   CPC ..... *H05K 7/20145* (2013.01); *H05K 7/20172* (2013.01); *F25B 2313/0271* (2013.01); *G06F 1/203* (2013.01)

(58) Field of Classification Search
   CPC .......... H05K 7/20836; H05K 7/20136; H05K 7/20554–20581; H05K 7/20736; G06F 1/20; G06F 1/203; G06F 1/206; G06F 1/3203; G06F 11/2289; G06F 11/3058; F25B 25/00; F25B 27/00; F25B 313/0271; F24F 11/17; F24F 11/001; F24F 11/63; F24F 11/65; F04D 19/002; G11B 33/142; G11B 33/144; Y02D 10/16
   USPC ..... 361/695, 692, 679.48; 700/280; 713/310
   See application file for complete search history.

(56) References Cited

U.S. PATENT DOCUMENTS

| | | | |
   |---|---|---|---|
   | 2,841,289 A | | 7/1958 | Odlum et al. |
   | 3,414,188 A | | 12/1968 | Gordon |
   | 4,563,126 A | | 1/1986 | Kobayashi et al. |
   | 4,902,196 A | | 2/1990 | Byrd |
   | 5,257,902 A | | 11/1993 | Atarashi et al. |
   | 5,265,348 A | | 11/1993 | Fleishman et al. |
   | 5,297,942 A | | 3/1994 | Fleishman et al. |
   | 5,689,404 A | * | 11/1997 | Katsui ................. H01L 23/3677 165/80.3 |
   | 5,694,294 A | | 12/1997 | Ohashi et al. |
   | 5,934,368 A | * | 8/1999 | Tanaka ................. F24F 11/0008 165/231 |
   | 5,949,646 A | * | 9/1999 | Lee ..................... H05K 7/2019 165/104.33 |
   | 6,011,689 A | * | 1/2000 | Wrycraft .................. G06F 1/20 361/679.31 |
   | 6,141,214 A | | 10/2000 | Ahn |
   | 6,452,797 B1 | | 9/2002 | Konstad |
   | 6,496,366 B1 | * | 12/2002 | Coglitore ................. G06F 1/18 174/377 |
   | 6,519,149 B1 | * | 2/2003 | Inoue ..................... G06F 1/203 165/104.26 |
   | 6,671,177 B1 | | 12/2003 | Han |
   | 6,681,845 B1 | | 1/2004 | Yeh et al. |
   | 6,914,782 B2 | | 7/2005 | Ku |
   | 6,924,978 B2 | | 8/2005 | Distefano |
   | 7,086,837 B2 | | 8/2006 | Kamoshita et al. |
   | 7,248,471 B2 | | 7/2007 | Wabiszczewicz |
   | 7,273,089 B2 | | 9/2007 | Hata et al. |
   | 7,298,615 B2 | | 11/2007 | Wong |
   | 7,317,614 B2 | | 1/2008 | Ruch et al. |
   | 7,348,743 B1 | * | 3/2008 | Corbett .................. G06F 1/20 318/268 |
   | 7,455,504 B2 | | 11/2008 | Hill et al. |
   | 7,630,201 B2 | * | 12/2009 | Asahi ..................... G05D 23/19 165/104.33 |
   | 7,697,290 B2 | | 4/2010 | Wu |
   | 7,764,493 B2 | | 7/2010 | Ali et al. |
   | 7,872,864 B2 | * | 1/2011 | Mongia ................... G06F 1/203 361/694 |
   | 7,898,805 B2 | | 3/2011 | MacDonald |
   | 8,075,276 B2 | | 12/2011 | Hwang et al. |
   | 8,175,757 B2 | * | 5/2012 | Aggus ....................... G06F 1/20 165/287 |
   | 8,190,276 B2 | * | 5/2012 | Lewis ..................... G05D 23/19 318/400.42 |
   | 9,551,352 B2 | | 1/2017 | MacDonald et al. |
   | 9,639,125 B2 | * | 5/2017 | Delano ..................... G06F 1/20 |
   | 9,746,001 B2 | | 8/2017 | MacDonald |
   | 10,185,351 B2 | * | 1/2019 | Yin .......................... G06F 1/16 |
   | 2002/0180285 A1 | | 12/2002 | Machiroutu |
   | 2003/0161102 A1 | | 8/2003 | Lee et al. |
   | 2004/0125558 A1 | | 7/2004 | Distefano |
   | 2004/0184914 A1 | | 9/2004 | Doege et al. |
   | 2005/0122682 A1 | | 6/2005 | Streit et al. |
   | 2008/0247134 A1 | | 10/2008 | Hwang et al. |
   | 2009/0000774 A1 | | 1/2009 | MacDonald et al. |
   | 2009/0120454 A1 | | 5/2009 | Ochs et al. |
   | 2010/0172095 A1 | | 7/2010 | MacDonald et al. |
   | 2011/0063795 A1 | | 3/2011 | Yeh et al. |
   | 2011/0159797 A1 | | 6/2011 | Beltman et al. |
   | 2012/0026677 A1 | * | 2/2012 | Bhutani ................. F04D 25/0613 361/679.48 |

FOREIGN PATENT DOCUMENTS

| | | |
   |---|---|---|
   | JP | 2001041196 A | 2/2001 |
   | JP | 2001082396 A | 3/2001 |
   | JP | 2003218568 A | 7/2003 |
   | JP | 2005290987 A | 10/2005 |
   | JP | 2006207519 A | 8/2006 |
   | JP | 2006299949 A | 11/2006 |
   | TW | 200813338 A | 3/2008 |
   | TW | 201312010 A | 3/2013 |
   | WO | 2013085510 A1 | 6/2013 |

OTHER PUBLICATIONS

International Search Report and Written Opinion, dated Jul. 24, 2012; Application No. PCT/US2011/063828, filed date Dec. 7, 2011; pp. 10.
   Office Action and Search Report received for Taiwanese Patent Application No. 103119371, dated Nov. 17, 2015, 17 pages including 9 pages English translation.
   Office Action and Search Report received for Chinese Patent Application No. 201180075352.8, dated Sep. 27, 2016, 12 pages incluidng translation.
   Office Action received for Japanese Patent Application No. 2014-545865, dated Apr. 28, 2015, 2 pages including, English translation.
   Office Action received for Korean Patent Application No. 2014-7015162, dated Feb. 3, 2016, 10 pages including 4 pages English translation.

* cited by examiner

REVERSIBLE DIRECTION THERMAL COOLING SYSTEM

TECHNICAL FIELD

This disclosure relates in general to the field of computing and/or device cooling, and more particularly, to a reversible direction thermal cooling system.

BACKGROUND

Emerging trends in systems place increasing performance demands on the system. The increasing demands can cause thermal increases in the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a reversible direction thermal cooling system. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

Figure 1A:
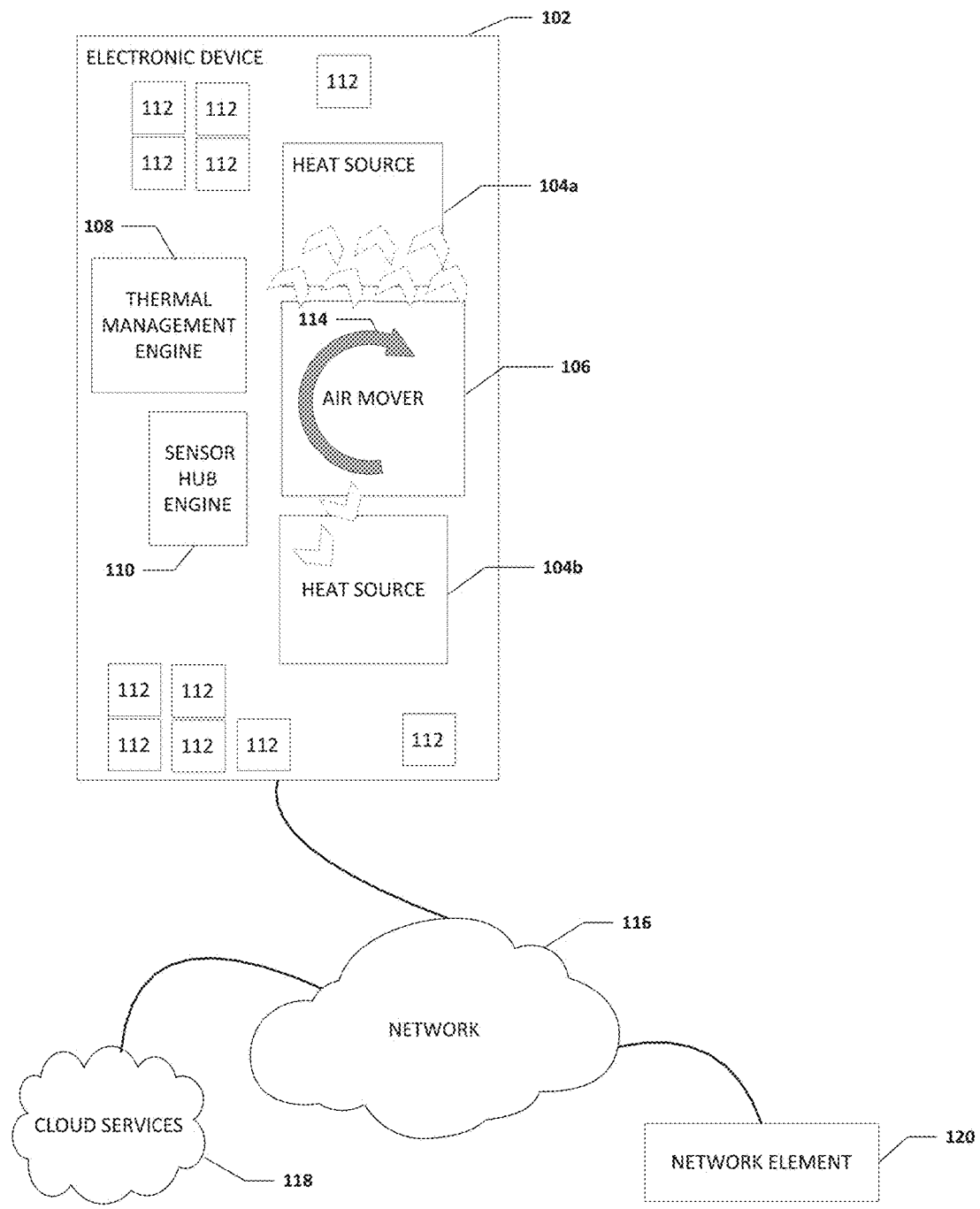
FIGS. 1A and 1B are a simplified block diagram of a system to enable a reversible direction thermal cooling system, in accordance with an embodiment of the present disclosure.

FIG. 1A is a simplified block diagram of an electronic device configured to enable a reversible direction thermal cooling system, in accordance with an embodiment of the present disclosure. In an example, electronic device 102 can include a plurality of heat sources 104a and 104b, an air mover 106, a thermal management engine 108, a sensor hub engine 110, and one or more electronics 112. Electronic device 102 may be in communication with cloud services 118 and/or network element 120 using network 116.

Each of heat sources 104a and 104b may be a heat generating device (e.g., processor, logic unit, field programmable gate array (FPGA), chip set, a graphics processor, graphics card, battery, memory, or some other type of heat generating device). Air mover 106 can be configured as an air cooling system and more particularly, a reversible direction thermal cooling system, to help reduce the temperature of heat source 104a or 104b. Thermal management engine 108 can be configured to control the velocity or speed of air mover 106 as well as the general direction a majority of the air from air mover 106 travels. More specifically, thermal management engine 108 can control the velocity or speed of air mover 106 as well as cause an air flow from air mover 106 that is biased in one direction to help cool a first heat source (e.g., heat source 104a) or cause an air flow from air mover 106 that is biased in an opposite direction to cool a second heat source (e.g., heat source 104b). Sensor hub engine 110 can be configured to collect data or thermal parameters related to heat source 104a and 104b and other components, elements, devices (e.g., electronics 112) in electronic device 102 and communicate the data to thermal management engine 108. The term "thermal parameters" includes a measurement, range, indicator, etc. of an element or condition that affects the thermal response, thermal state, and/or thermal transient characteristics of the heat source associated with the thermal parameters. The thermal parameters can include a platform workload intensity, a CPU workload or processing speed, a data workload of a neighboring device, fan speed, air temperature (e.g., ambient air temperature, temperature of the air inside the platform, etc.), power dissipation of the device, or other indicators that may affect the thermal condition of the device. Each of electronics 112 can be a device or group of devices available to assist in the operation or function of electronic device 102.

It is to be understood that other embodiments may be utilized and structural changes may be made without departing from the scope of the present disclosure. Substantial flexibility is provided by electronic device 102 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

Elements of FIG. 1 may be coupled to one another through one or more interfaces employing any suitable connections (wired or wireless), which provide viable pathways for network (e.g., network 116, etc.) communications. Additionally, any one or more of these elements of FIG. 1 may be combined or removed from the architecture based on particular configuration needs. Network 116 may include a configuration capable of transmission control protocol/Internet protocol (TCP/IP) communications for the transmission or reception of packets in a network. Electronic device 102 may also operate in conjunction with a user datagram protocol/IP (UDP/IP) or any other suitable protocol where appropriate and based on particular needs.

For purposes of illustrating certain example techniques of electronic device 102, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems.

For example, in some devices, it can be difficult to cool a particular heat source when the system is biased to cool a different heat source especially when the design uses a single central air mover to cool two different heat sources and the entire system. More specifically, some air cooling fans are biased to move air over one heat source (e.g., a processor) while another heat source (e.g., a graphics card) on an opposite side of the device sees a relatively small amount of air movement. In an illustrative example, high performance mobile gaming devices can be constrained from the perspective of system thermals. Generally, there is insufficient space/volume to provide thermal design power level support for both the computer processing unit (CPU) which is typically on one side of the device and graphics processor which is on the opposite side of the device. If an air cooling system is biased towards the CPU but the graphics processor needs to be cooled, a fan speed increase is possibly unnecessarily as the entire platform is cooled instead of the graphics processor. Also, due to the increased fan speed, platform power usage and acoustic energy of the device is higher than needed. What is needed is a reversible direction thermal cooling system that can help cool a heat source on one side of a device, then switch directions and cool a second heat source on the other side of the device.

Figure 1B:
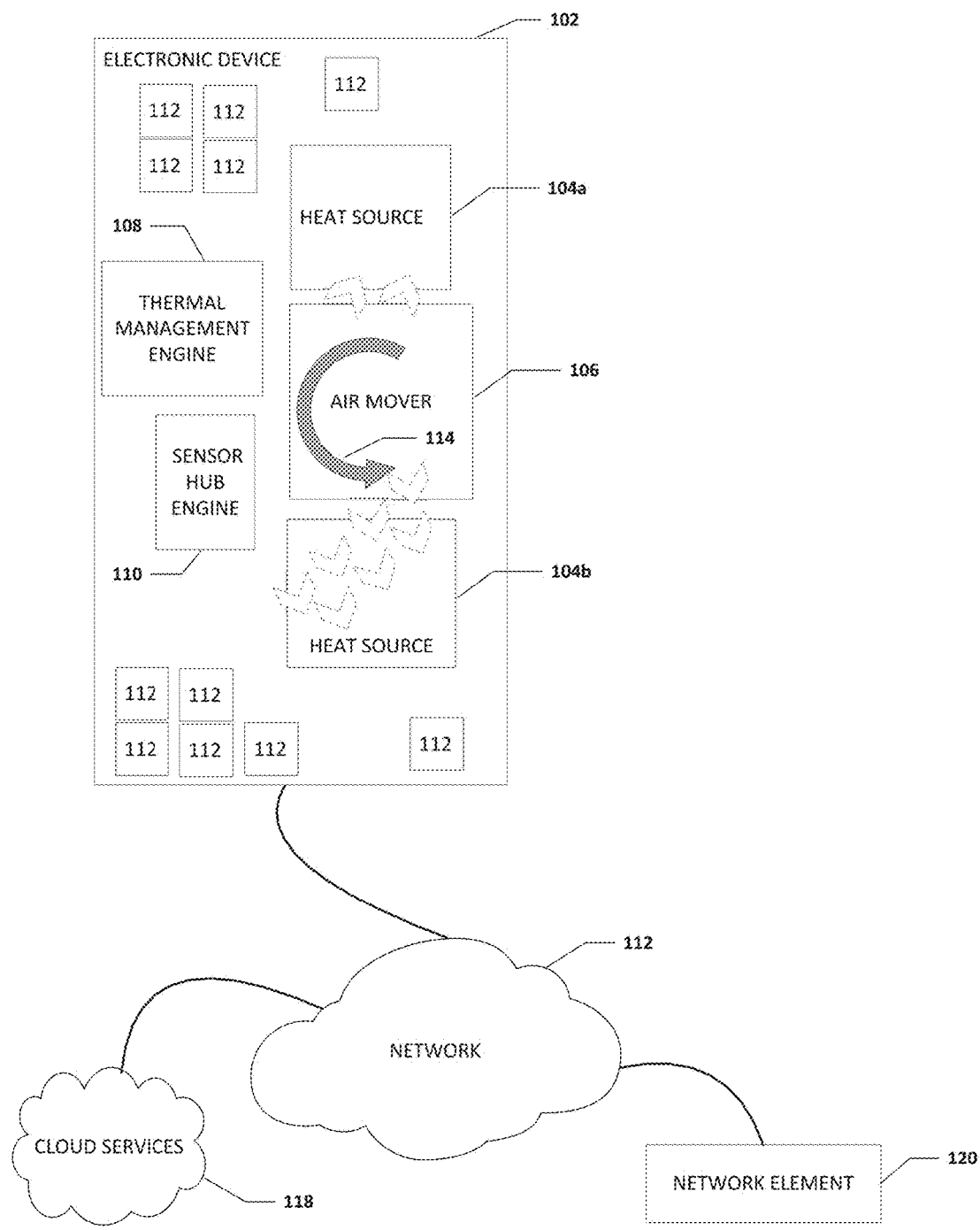

A device to help mitigate the thermal challenges of a system, as outlined in FIG. 1, can resolve these issues (and others). In an example, an electronic device (e.g., electronic device 102) that uses a single central air mover to cool at least two different heat sources can be configured to allow for a dynamic reversible direction thermal cooling system by analyzing thermal parameters related to heat sources and adjusting the air mover accordingly so the air flow is biased in one direction to help cool a first heat source (e.g., heat source 104a) or cause an air flow from air mover 106 that is biased in an opposite direction to cool a second heat source (e.g., heat source 104b). More specifically, a sensor hub engine (e.g., sensor hub engine 110) can be configured to collect or determine thermal parameters for a plurality of heat sources (e.g., heat sources 104a and 104b). The heat source senor engine can continually update the thermal parameters for each source according to changing conditions. The thermal parameters from the heat source engine can be used by a thermal management engine (e.g., thermal management engine 108) to control air mover 106 and cause an air flow that is biased in one direction to cool a first heat source or is biased in an opposite direction to cool a second heat source. When the air flow is biased in one direction, approximately about three fourths to about two thirds of the air will flow in the direction of the bias and approximately one fourth to about one third of the air will flow in the direction opposite of the bias. For example, with reference to FIG. 1A, the air flow is biased towards heat source 104a and approximately about three fourths to about two thirds of the air will flow in the direction of heat source 104a and approximately one fourths to about one third of the air will flow in the direction opposite of the bias towards heat source 104b. If heat source 104b needs to be cooled more than heat source 104a (e.g., heat source 104b has a higher temperature and/or workload than heat source 104a or, due to anticipated or predicted conditions, heat source 104b is anticipated or predicted to have a higher temperature and/or workload than heat source 104a), the bias can be reversed as illustrated in FIG. 1B such that the air flow is biased towards heat source 104b and approximately about three fourths to about two thirds of the air will flow in the direction of heat source 104b and approximately one fourths to about one third of the air will flow in the direction opposite of the bias towards heat source 104a.

The system can be configured to help provide a way to dynamically shift a portion of the thermal cooling resources between one heat source and a second heat source, as needed, depending on the current thermal parameters of each heat source as well as predicted thermal parameters of each heat source. In an example, the system can be configured to determine a predicted workload and shift a portion of the thermal cooling resources between a first heat source and a second heat source, depending on the predicted workload (e.g., a process or application is initialized and the process or application is graphics intensive and will increase the thermal characteristics of a graphics card). The system does not significantly impact system size, weight, or acoustics. In a specific example, a volumetric resistance blower (VRB) dish fan and a technique for reversing the fan spin may be used. Reversing the blower direction can significantly redistribute cooling flow within the system. Because the VRB design is symmetric when used as a dish fan, it is essentially completely reversible and can reverse flow patterns without any loss of efficiency or any acoustic penalty, allowing flow to be distributed on demand across the processor and graphics portions of the thermal solution(s). The term "dish fan" includes a radial fan or caseless fan. The dish fan allows for changing the bias of the air flow from the fan by only changing the direction of rotation of the fan and not requiring any physical change to the housing, baffles, channels, doors, etc.

In an example, each heat source can include an internal temperature sensor that determines the temperature of the device. The heat source's temperature is reported to the sensor hub engine 110 and stored in a device thermal parameters table (e.g., thermal table 132 illustrated in FIG. 6). Sensor hub engine 110 reports the heat source's temperature and other thermal parameters to thermal management engine 108 to be used to control the speed (e.g., revolutions per minute (RPM)) and directional bias of air mover 106.

Because of the aerodynamic flow field created by the rotation of the air mover (e.g., a dish fan), the majority of the flow (approximately two thirds to three fourths of total air flow) is driven out of one side (e.g., the right-hand side (RHS)). In some current solutions, the orientation of the fan is usually chosen to favor a particular side of the system, which is typically the higher power side, more likely to be overclocked, and/or more likely to have an increased thermal response as compared to the rest of the system. Baffles, channels, and sizing can all be used to affect the flow split between one side and another side, but those measures are all static and also generally reduce total flow in order to affect the balance between sides. Current fans and fan orientation are not easily reversible, which would allow for the majority of flow to be swapped from one side to the other in order to facilitate workload-specific cooling optimization. This is because of blade shaping, sloping, and other physical features of the fan blade design that are required for high aerodynamic and aeroacoustics efficiencies. If the direction of rotation for a fixed dish fan is reversed, the flow and pressure performance is severely reduced. Air mover 106 can be configured to overcome these limitations.

In an example, air mover 106 can be a dish fan whose rotation direction can be reversed without any loss of performance (i.e., the performance of the dish fan works equally well in a first direction and in a second opposite direction). The dish fan can be a completely symmetric rotor design using a continuous porous medium in place of discrete blades. The primary purpose for the porous rotor design is geared towards certain acoustic and dynamic advantages over traditional rotors, but it also has the convenient property of complete symmetry meaning it can be reversed without any loss in flow or acoustic efficiency. Thus, allowing systems to dynamically adjust flow to optimize cooling for one side or the other side depending on the current workload. The only required system adjustment would be a small change in the fan motor control board that allows for motor direction reversal, and an extra lead added to the fan connection header in order to signal/control the reversal. A traditional dish fan with a symmetric blade design may also be used for this type of flow reversal. The symmetrically bladed dish fan would not have the same aerodynamic or aeroacoustics performance as a typical asymmetric design, but it would allow for flow reversal without further performance penalties.

Turning to the infrastructure of FIG. 1, network 116 represents a series of points or nodes of interconnected communication paths for receiving and transmitting packets of information. Network 116 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 116, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

In an example implementation, electronic device 102, is meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes at least a first heat source on a first side and at least a second heat source on a second side. In an example, the first side is opposite the second side. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements for storing information to be used in the operations outlined herein. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, the functions outlined herein may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities described herein.

In an example implementation, electronic device 102 may include software modules (e.g., thermal management engine 108, sensor hub engine 110, etc.) to achieve, or to foster, operations as outlined herein. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations, as outlined herein.

Additionally, electronic device 102 may include a processor that can execute software or an algorithm to perform activities as discussed herein. A processor can execute any type of instructions associated with the data to achieve the operations detailed herein. In one example, the processors could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
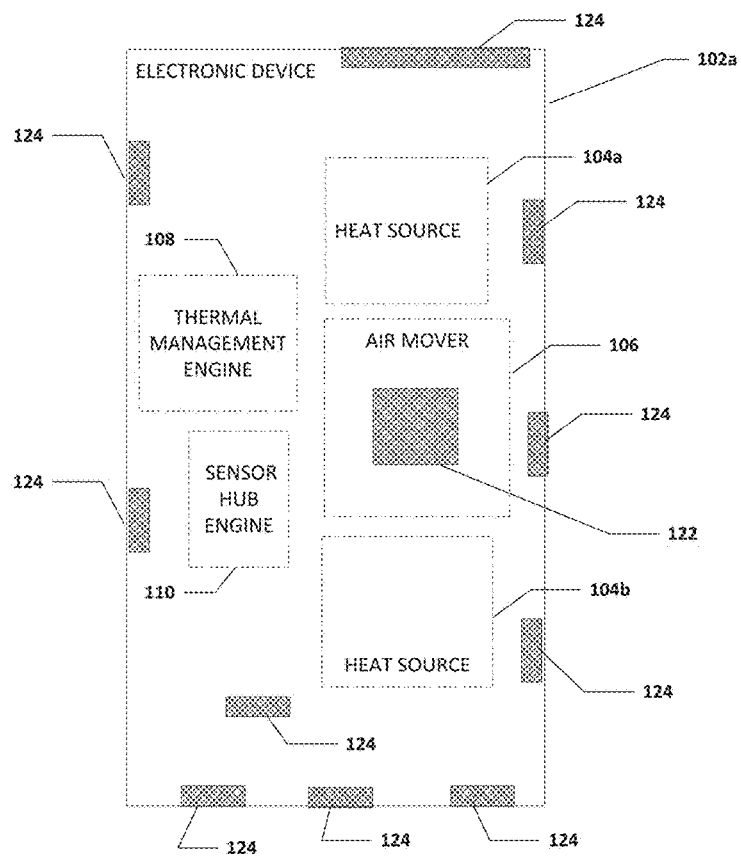
FIGS. 2A and 2B are a simplified block diagram of a portion of a system to enable a reversible direction thermal cooling system, in accordance with an embodiment of the present disclosure.
Figure 2B:
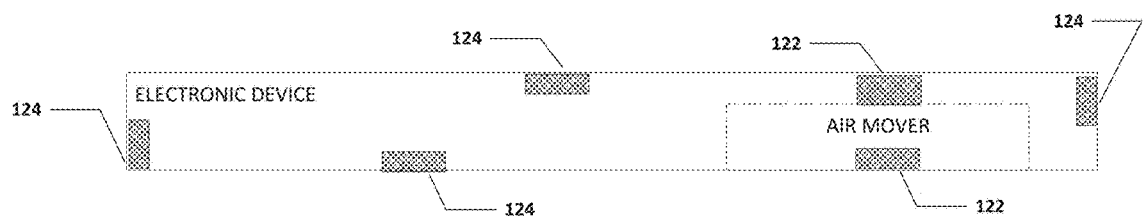

Turning to FIGS. 2A and 2B, FIGS. 2A and 2B are a simplified block diagram of electronic device 102a configured to include a hyperbaric cooling system. In an example, the hyperbaric cooling system is a cooling system as disclosed in U.S. Pat. No. 7,898,805 and incorporated herein by reference. In an example, one or more inlets 122 may be located above, below, and or proximate to air mover 106. In addition, one or more exhaust vents 124 may be positioned at the periphery of electronic device 102a. Air mover 106 includes an inlet that draws air in through one or more inlets 122 and generates a positive pressure within the enclosure or chassis of electronic device 102a. Inlet 122 allows air to be drawn into air mover 106 at the top and/or bottom of air mover 106 and at the top and bottom surfaces of the enclosure or chassis of electronic device 102a. This can generate a positive pressure within the enclosure or chassis of electronic device 102a. The distribution of the air may be biased in a first direction and then air mover 106 can be reversed to bias the distribution of the air in a second opposite direction.

Figure 3A:
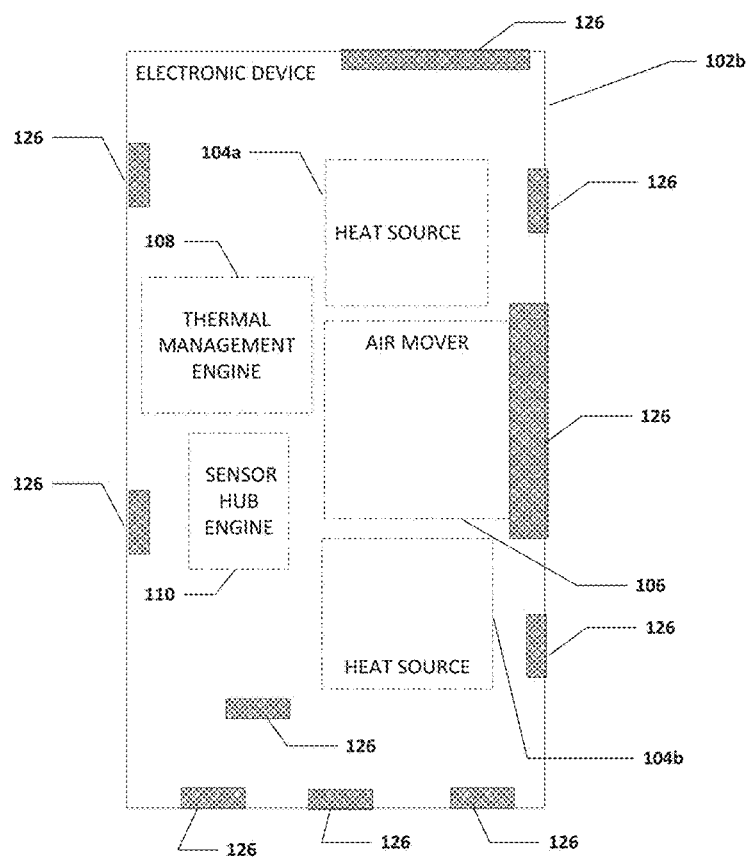
FIGS. 3A and 3B are a simplified block diagram of a portion of a system to enable a reversible direction thermal cooling system, in accordance with an embodiment of the present disclosure.
Figure 3B:
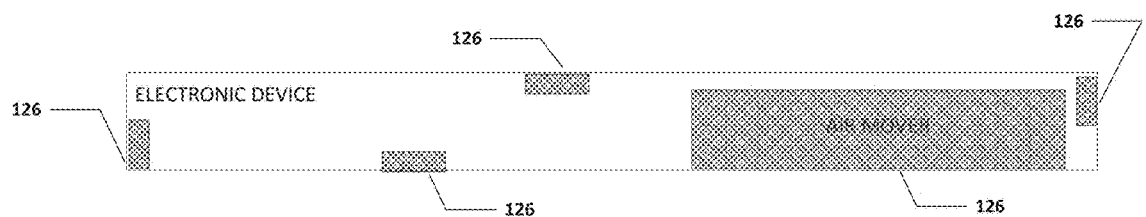

Turning to FIGS. 3A and 3B, FIGS. 3A and 3B are a simplified block diagram of electronic device 102b configured to include a vented cooling system. In an example, one or more inlets/vents 126 may be located proximate to air mover 106. In addition, one or more inlets/vents 126 may be positioned at the periphery of electronic device 102b. Air mover 106 includes an inlet that draws air in through one or more inlets/vents 126 and distributes the air within the enclosure or chassis of electronic device 102b. The distribution of the air may be biased in a first direction and then air mover 106 can be reversed to bias the distribution of the air in a second opposite direction.

Figure 4:
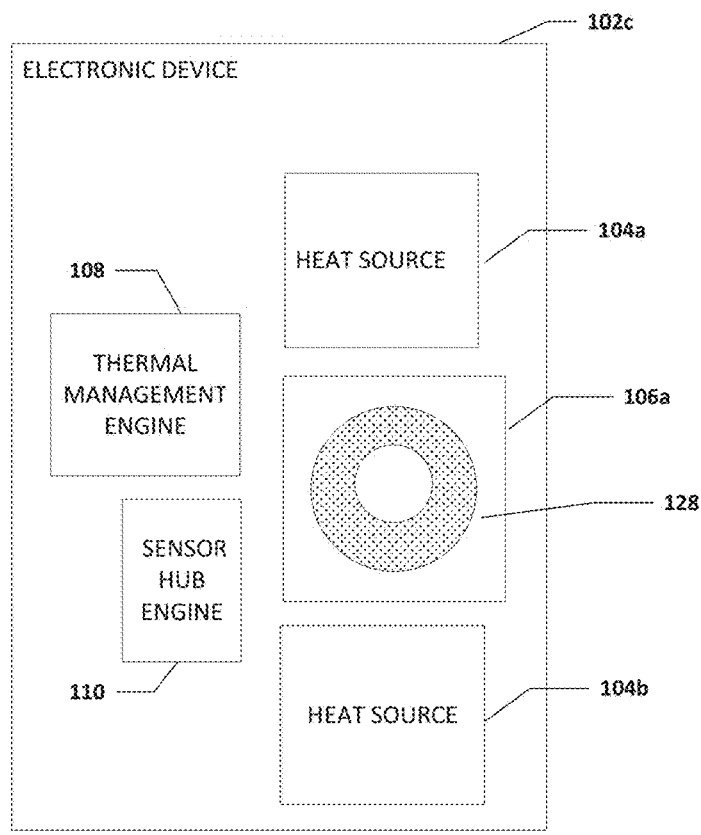
FIG. 4 is a simplified block diagram of a portion of a system to enable a reversible direction thermal cooling system, in accordance with an embodiment of the present disclosure.

Turning to FIG. 4, FIG. 4 is a simplified block diagram of electronic device 102c configured to include a VRB fan system. In an example, air mover 106a can include a VRB fan 128. In an example, VRB fan 128 is a VRB as disclosed in U.S. Pat. No. 9,551,352 and/or U.S. Pat. No. 9,746,001, both incorporated herein by reference.

VRB fan 128 is a VRB dish fan and can be a cylindrical foam block rotor that is rotated by a motor. VRB fan 128 can be rotated at varying speeds in a first direction and then reversed to rotate at varying speeds in a second opposite direction. VRB fan 128 can be an open-cell structured foam material that allows air to fill the open cells and pass through as VRB fan 128 is rotated. In an example, VRB fan 128 can have a substantially contiguous radius and a flat or smooth edge that forms an outer perimeter of VRB fan 128. In other examples, VRB fan 128 may have rounded or otherwise shaped edges or corners. VRB fan 128 includes a substantially flat top surface having no blades or fins and a substantially flat bottom surface also having no blades or fins. In some examples, VRB fan 128 can include one or more internal dividers arranged to prevent azimuthal circulation inside the cylindrical foam of VRB fan 128.

Figure 5:
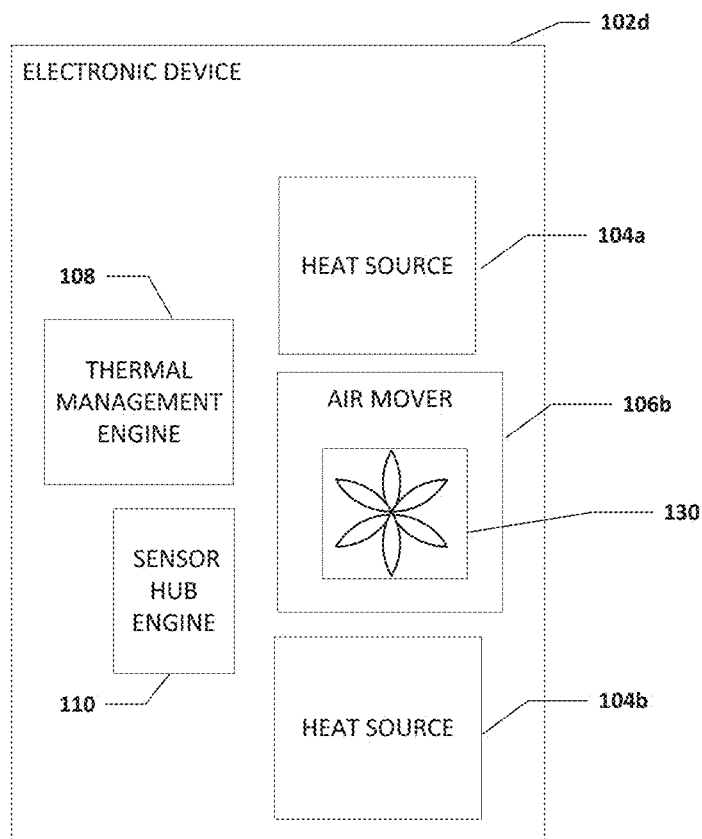
FIG. 5 is a simplified block diagram of a portion of a system to enable a reversible direction thermal cooling system, in accordance with an embodiment of the present disclosure.

Turning to FIG. 5, FIG. 5 is a simplified block diagram of electronic device 102d configured to include a bladed fan system. In an example, air mover 106b can include a bladed fan 130. In an example, bladed fan 130 can be rotationally symmetric or a symmetrical or radial bladed dish fan where the fins of bladed fan 130 may be relatively straight such that the volume of air that is moved when air mover 106b is biased in one direction is relatively the same as the volume of air that is moved when air mover 106b is biased in the opposite direction. In another example, the fins of bladed fan 130 may be curved or biased on one direction however other means (e.g., channels or baffles) may need to be introduced to ensure that the volume of air that is moved when air mover 106b is biased in one direction is relatively the same as the volume of air that is moved when air mover 106b is biased in the opposite direction.

Figure 6:
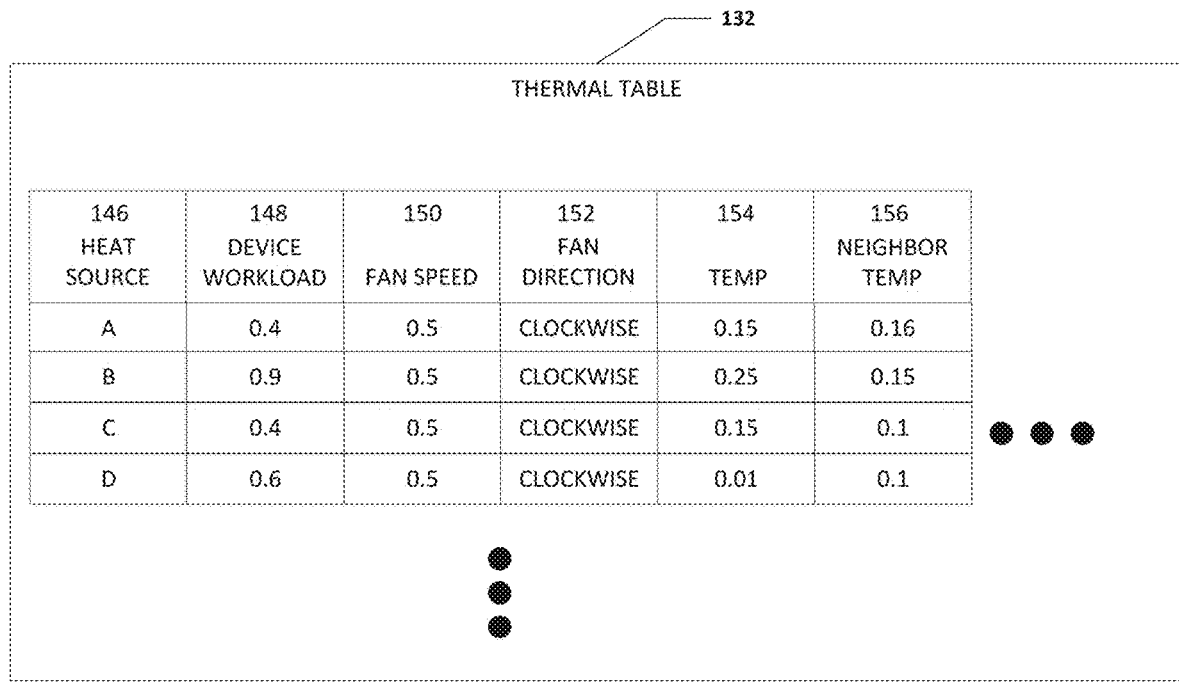
FIG. 6 is a simplified table illustrating example details that may be associated with a system to enable a reversible direction thermal cooling system, in accordance with an embodiment of the present disclosure.

Turning to FIG. 6, FIG. 6 is a simplified block diagram of example details of a thermal table 132 for use in electronic device 102, in accordance with an embodiment of the present disclosure. Thermal table 132 can include a heat source identification (ID) column 146, a device workload column 148, a fan speed column 150, a fan direction column 152, a temperature column 154, a neighbor temperature column 156, and other contributing thermal parameters that may be used to help determine a velocity and direction of bias for air mover 106. Thermal table 132 can be used by thermal management engine 108 to determine the speed and direction (e.g., clockwise or anti clockwise) of air mover 106. If the thermal parameters of one side indicate that the temperature of a heat source on that side is or will be increasing, then thermal management engine 108 can bias the airflow from air mover 106 to that side. If the thermal parameters of the other side indicate that the temperature of a heat source on that side is or will be increasing, then thermal management engine 108 can bias the airflow from the air mover to the other side.

Heat source ID column 146 includes an identification of a specific heat source. Device workload column 148 includes an indicator of the amount the workload of the specific heat source identified in heat source ID column 146. Fan speed column 150 includes an indicator of the fan speed of a fan (e.g., VRB fan 128, bladed fan 130, etc.) in air mover 106. Fan direction column 152 includes an indicator of the direction of rotation of a fan (e.g., VRB fan 128, bladed fan 130, etc.) in air mover. The direction of rotation indicates whether air mover 106 causes the air to move or is biased in a first direction or a second direction. For example, a clockwise rotation may bias a majority of the air to move in a first direction over a first heat source (e.g., heat source 104a) and a counter clockwise rotation may bias a majority of the air to move in a second direction over a second heat source (e.g., heat source 104b). Temperature column 154 includes an indicator of the temperature of one or more neighbors that will affect the thermal response of the specific heat source identified in heat source ID column 146. The indicators in device workload column 148, fan speed column 150, fan direction column 152, temperature column 154, and neighbor temperature column 156, and other contributing thermal parameters can be weighted for each device. For example, a workload for a specific heat source may have a greater impact on the thermal response of the specific heat source than a workload for a second specific heat source. The data in device workload column 148, fan speed column 150, fan direction column 152, temperature column 154, and neighbor temperature column 156 can be acquired or collected by sensor hub engine 110.

Figure 7:
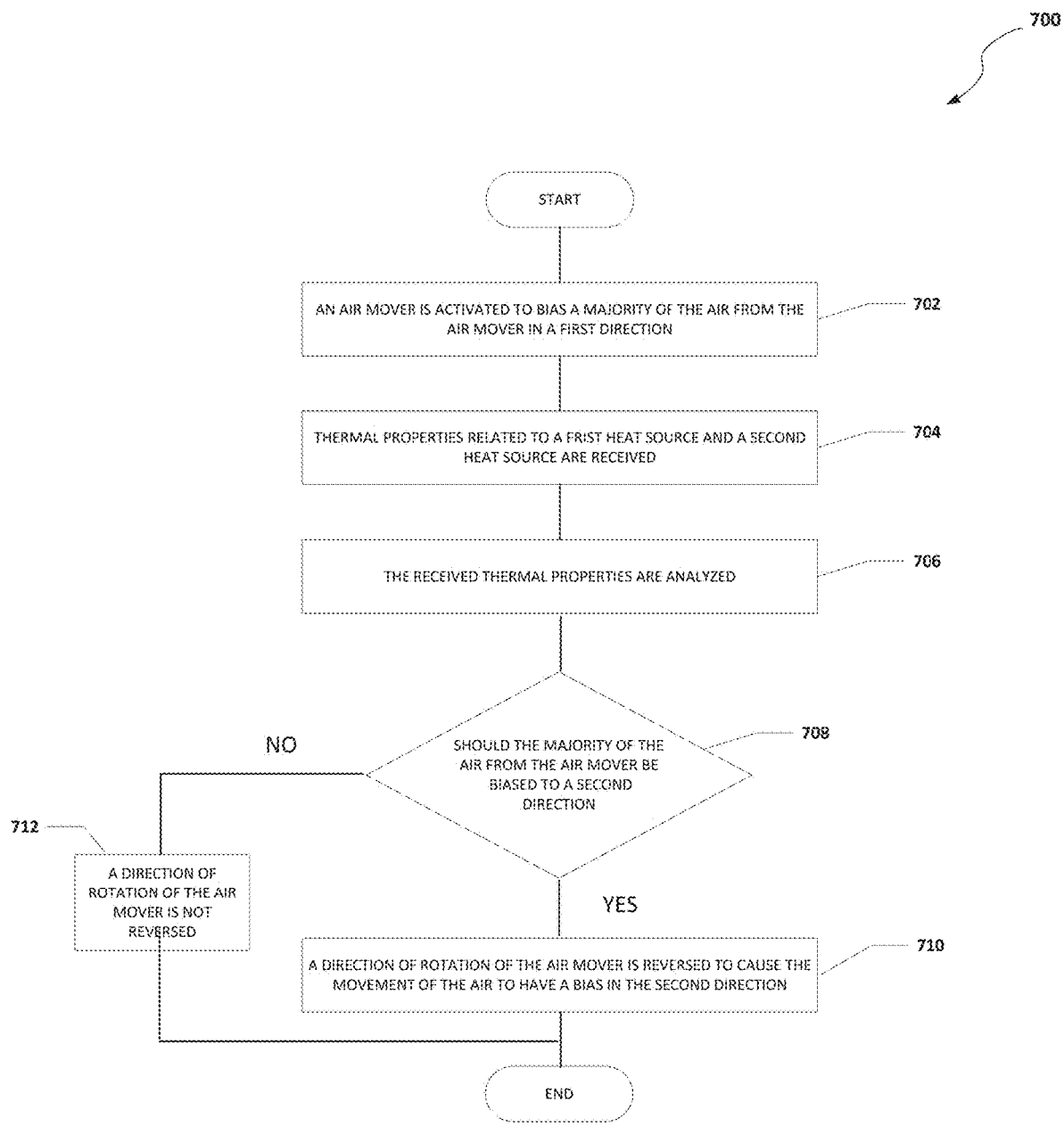
FIG. 7 is a simplified flowchart illustrating potential operations that may be associated with the system in accordance with an embodiment.

Turning to FIG. 7, FIG. 7 is an example flowchart illustrating possible operations of a flow 700 that may be associated with enabling a disposition of a workload based on a thermal response of a device, in accordance with an embodiment. In an embodiment, one or more operations of flow 700 may be performed by thermal management engine 108 and/or sensor hub engine 110. At 702, an air mover is activated to bias a majority of the air from the air mover in a first direction. At 704, thermal properties related to a first heat source and a second heat source are received. At 706, the received thermal properties are analyzed. At 708, the system determines if the majority of the air from the air mover should be biased to a second direction. If the system determines the majority of the air from the air mover should be biased to a second direction, then a direction of rotation of the air mover is reversed to cause the movement of the air to have a bias in the second direction, as in 710. If the system determines the majority of the air from the air mover should not be biased to a second direction, then a direction of rotation of the air mover is not reversed. The flow can continue at 704 where thermal properties related to a first heat source and a second heat source are received and the system continues to determine if the rotation of the air mover should be reversed to bias the air in an opposite direction.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. For example, electronic device 102 may include two or more air movers 106 with each air mover being independently controlled by thermal management engine 108 or controlled as a unit or group. Additionally, although electronic device 102 has been illustrated with reference to particular elements and operations that facilitate the thermal cooling process, these elements and operations may be replaced by any suitable architecture, protocols, and/or processes that achieve the intended functionality disclosed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, an electronic device can include memory, a thermal management engine, an air mover, a first heat source, a second heat source, and at least one processor. The the thermal management engine is configured to cause the least one processor to receive data related to thermal properties of a first heat source, activate an air mover based on the received data related to the thermal properties of the first heat source, where a majority of air moved by the air mover is biased a first direction, determine that the majority of the air should have a bias in a second direction, and reverse a direction of rotation of the air mover to cause the air moved by the air mover to have a bias in the second direction.

In Example A2, the subject matter of Example A1 can optionally include where wherein the second direction is towards a second heat source and relatively opposite the first direction, wherein the first direction is towards the first heat source.

In Example A3, the subject matter of any one of Examples A1-A2 can optionally include where the air mover is a volumetric resistance blower dish fan.

In Example A4, the subject matter of any one of Examples A1-A3 can optionally include where the air mover is a bladed dish fan.

In Example A5, the subject matter of any one of Examples A1-A4 can optionally include where the air mover is part of a hyperbaric cooling system.

In Example A6, the subject matter of any one of Examples A1-A5 can optionally include a sensor hub engine, where the sensor hub engine is configured to collect thermal parameters related to each of the first heat source and the second heat source and communicate the thermal parameters to the thermal management engine.

In Example A7, the subject matter of any one of Examples A1-A6 can optionally include where the first heat source is a processor and the second heat source is a graphics card.

Example C1 is at least one machine readable storage medium having one or more instructions that when executed by at least one processor, cause the at least one processor to receive data related to thermal properties of a first heat source, activate an air mover based on the received data related to the thermal properties of the first heat source, wherein the air mover rotates in a first direction a majority of air moved by the air mover is biased in a first direction towards the first heat source, determine that the majority of the air moved by the air mover should have a bias in a second direction, and reverse a direction of rotation of the air mover to cause the air moved by the air mover to have a bias in the second direction towards the second heat source.

In Example C2, the subject matter of Example C1 can optionally include where the second direction is relatively opposite the first direction.

In Example C3, the subject matter of any one of Examples C1-C2 can optionally include where the air mover is a volumetric resistance blower dish fan.

In Example C4, the subject matter of any one of Examples C1-C3 can optionally include where the air mover is a bladed dish fan.

In Example C5, the subject matter of any one of Examples C1-C4 can optionally include where the one or more instructions further cause the at least one processor to receive data related to second thermal properties of a second heat source where the second thermal properties at least partially cause the determine that (the majority of) the air should be moved in the second direction.

In Example C6, the subject matter of any one of Examples C1-C5 can optionally include where the first heat source is a processor and the second heat source is a graphics card.

In Example C7, the subject matter of any one of Examples C1-C6 can optionally include where the machine readable medium is part of a hyperbaric cooling system.

Example M1 is a method including receiving data related to thermal properties of a first heat source, activating an air mover based on the received data related to the thermal properties of the first heat source, where a majority of air moved by the air mover is biased a first direction, determining that the majority of the air moved by the air mover should have a bias in a second direction, and reversing a direction of rotation of the air mover to cause the air moved by the air mover to have a bias in the second direction.

In Example M2, the subject matter of Example M1 can optionally include where the second direction is relatively opposite the first direction.

In Example M3, the subject matter of any one of the Examples M1-M2 can optionally include where the air mover is a volumetric resistance blower dish fan.

In Example M4, the subject matter of any one of the Examples M1-M3 can optionally include where the air mover is a bladed dish fan.

In Example M5, the subject matter of any one of the Examples M1-M4 can optionally include where the air mover is part of a hyperbaric cooling system.

Example S1 is a system for a reversible direction thermal cooling system. The system can include memory, a thermal management engine, an air mover, a first heat source, a second heat source, at least one processor, and a sensor hub engine. The thermal management engine is configured to cause the least one processor to receive data related to thermal properties of a first heat source, activate an air mover based on the received data related to the thermal properties of the first heat source, where a majority of air from the air mover is biased a first direction towards the first heat source, determine that the majority of the air should have a bias in a second direction, and reverse a direction of rotation of the air mover to cause the air to have a bias in the second direction towards the second heat source. The the sensor hub engine is configured to cause the least one processor to collect thermal parameters related to each of the first heat source and the second heat source and communicate the thermal parameters to the thermal management engine.

In Example S2, the subject matter of Example S1 can optionally include where the second direction is relatively opposite the first direction.

In Example S3, the subject matter of any one of the Examples S1-S2 can optionally include where the air mover is a volumetric resistance blower dish fan.

In Example S4, the subject matter of any one of the Examples S1-S3 can optionally include where the air mover is a bladed dish fan.

In Example S5, the subject matter of any one of the Examples S1-S4 can optionally include where the first heat source is a processor and the second heat source is a graphics card.

In Example S6, the subject matter of any one of the Examples S1-S5 can optionally include where the system is a hyperbaric cooling system.

Example AA1 is an apparatus including means for receiving data related to thermal properties of a first heat source, means for activating an air mover based on the received data related to the thermal properties of the first heat source, where a majority of the air is biased a first direction, means for determining that the majority of the air should have a bias in a second direction, and means for reversing a direction of rotation of the air mover to cause the air to have a bias in the second direction.

In Example AA2, the subject matter of Example AA1 can optionally include where the second direction is relatively opposite the first direction.

In Example AA3, the subject matter of any one of Examples AA1-AA2 can optionally include where the air mover is a volumetric resistance blower dish fan.

In Example AA4, the subject matter of any one of Examples AA1-AA3 can optionally include where the air mover is a bladed dish fan.

In Example AA5, the subject matter of any one of Examples AA1-AA4 can optionally include means for receiving data related to second thermal properties of a second heat source where the second thermal properties at least partially cause the determine that (the majority of) the air should be moved in the second direction.

In Example AA6, the subject matter of any one of Examples AA1-AA5 can optionally include where the first heat source is a processor and the second heat source is a graphics card.

In Example AA7, the subject matter of any one of Examples AA1-AA6 can optionally include where he machine readable medium is part of a hyperbaric cooling system.

Example X1 is a machine-readable storage medium including machine-readable instructions to implement a method or realize an apparatus as in any one of the Examples A1-A7, AA1-AA7, or M1-M5. Example Y1 is an apparatus comprising means for performing any of the Example methods M1-M5. In Example Y2, the subject matter of Example Y1 can optionally include the means for performing the method comprising a processor and a memory. In Example Y3, the subject matter of Example Y2 can optionally include the memory comprising machine-readable instructions.

What is claimed is:

1. At least one machine readable medium comprising one or more instructions that, when executed by at least one processor, causes the at least one processor to:
   receive data related to thermal properties of a first heat source, wherein the first heat source is on a first side of an air mover;
   activate the air mover based on the received data related to the thermal properties of the first heat source, wherein a majority of air moved by the air mover is biased in a first direction;
   receive data related to second thermal properties of a second heat source, wherein the second heat source is on a second side of the air mover and the second side of the air mover is opposite the first side of the air mover;
   determine that the majority of the air moved by the air mover should have a bias in a second direction; and
   reverse a direction of rotation of the air mover to cause the air moved by the air mover to have a bias in the second direction, wherein intakes for the majority of air moved by the air mover when the air mover is biased in the first direction is the same as when the air mover is biased in the second direction.

2. The at least one machine readable medium of claim 1, wherein the second direction is towards the second heat source and is relatively opposite the first direction, wherein the first direction is towards the first heat source.

3. The at least one machine readable medium of claim 1, wherein the air mover is a volumetric resistance blower dish fan.

4. The at least one machine readable medium of claim 1, wherein the first heat source is a processor and the second heat source is a graphics card.

5. The at least one machine readable medium of claim 1, wherein the machine readable medium is part of a hyperbaric cooling system.

6. The at least one machine readable medium of claim 1, wherein approximately a same volume of air is moved by the air mover when the air mover is biased in the first direction or the second direction.

7. The at least one machine readable medium of claim 1, wherein one or more intake vents supply at least a portion of the air to the air mover and the one or more intake vents are on a side of a housing that includes the first heat source, the second heat source, and the air mover.

8. An electronic device comprising:
   memory;
   a thermal management engine;
   an air mover;
   a first heat source;
   a second heat source; and
   at least one processor, wherein the thermal management engine is configured to cause the least one processor to:
   receive data related to thermal properties of a first heat source, wherein the first heat source is on a first side of the air mover;
   activate the air mover based on the received data related to the thermal properties of the first heat source, wherein the air mover rotates in a first direction and a majority of air moved by the air mover is biased in a first direction towards the first heat source;
   receive data related to second thermal properties of the second heat source, wherein the second heat source is on a second side of the air mover and the second side of the air mover is opposite the first side of the air mover;
   determine that the majority of the air moved by the air mover should have a bias in a second direction; and
   reverse a direction of rotation of the air mover to cause the air moved by the air mover to have a bias in the second direction towards the second heat source, wherein intakes for the majority of air moved by the air mover when the air mover is biased in the first direction is the same as when the air mover is biased in the second direction.

9. The electronic device of claim 8, wherein the second direction is relatively opposite the first direction.

10. The electronic device of claim 8, wherein the air mover is a volumetric resistance blower dish fan.

11. The electronic device of claim 8, wherein the air mover is a bladed dish fan.

12. The electronic device of claim 8, wherein the air mover is part of a hyperbaric cooling system.

13. The electronic device of claim 8, further comprising:
   a sensor hub engine, wherein the sensor hub engine is configured to collect thermal parameters related to each of the first heat source and the second heat source and communicate the thermal parameters to the thermal management engine.

14. The electronic device of claim 8, wherein the first heat source is a processor and the second heat source is a graphics card.

15. A method comprising:
   receiving data related to thermal properties of a first heat source, wherein the first heat source is on a first side of an air mover;
   activating the air mover based on the received data related to the thermal properties of the first heat source, wherein a majority of air moved by the air mover is biased in a first direction;
   receiving data related to second thermal properties of a second heat source, wherein the second heat source is on a second side of the air mover and the second side of the air mover is opposite the first side of the air mover;
   determining that the majority of the air moved by the air mover should have a bias in a second direction; and
   reversing a direction of rotation of the air mover to cause the air moved by the air mover to have a bias in the second direction, wherein intakes for the majority of air moved by the air mover when the air mover is biased in the first direction is the same as when the air mover is biased in the second direction.

16. The method of claim 15, wherein the second direction is relatively opposite the first direction.

17. The method of claim 15, wherein the air mover is a volumetric resistance blower dish fan.

18. The method of claim 15, wherein the air mover is a bladed dish fan.

19. The method of claim 15, wherein the air mover is part of a hyperbaric cooling system.

20. A system for a reversible direction thermal cooling system, the system comprising:
   memory;
   a thermal management engine;
   an air mover;
   a first heat source;
   a second heat source;
   at least one processor, wherein the thermal management engine is configured to cause the least one processor to:

receive data related to thermal properties of the first heat source, wherein the first heat source is on a first side of the air mover;

activate the air mover based on the received data related to the thermal properties of the first heat source, wherein a majority of air from the air mover is biased in a first direction towards the first heat source;

receive data related to second thermal properties of the second heat source, wherein the second heat source is on a second side of the air mover and the second side of the air mover is opposite the first side of the air mover;

determine that the majority of the air should have a bias in a second direction; and reverse a direction of rotation of the air mover to cause the air to have a bias in the second direction towards the second heat source, wherein intakes for the majority of air moved by the air mover when the air mover is biased in the first direction is the same as when the air mover is biased in the second direction; and a sensor hub engine, wherein the sensor hub engine is configured to cause the least one processor to collect thermal parameters related to each of the first heat source and the second heat source and communicate the thermal parameters to the thermal management engine.

21. The system of claim 20, wherein the second direction is relatively opposite the first direction.

22. The system of claim 20, wherein the air mover is a volumetric resistance blower dish fan.

23. The system of claim 20, wherein the air mover is a bladed dish fan.

24. The system of claim 20, wherein the first heat source is a processor and the second heat source is a graphics card.

25. The system of claim 20, wherein the system is a hyperbaric cooling system.

* * * * *

UNITED STATES PATENT AND TRADEMARK OFFICE
CERTIFICATE OF CORRECTION

PATENT NO. : 10,545,546 B2
APPLICATION NO. : 15/904291
DATED : January 28, 2020
INVENTOR(S) : Krishnakumar Varadarajan et al.

It is certified that error appears in the above-identified patent and that said Letters Patent is hereby corrected as shown below:

In the Drawings

On Sheet 8 of 8, FIG. 7, Reference Numeral 704, Line 1, delete "FRIST" and insert -- FIRST --, therefor.

In the Claims

In Column 13, Line 57, in Claim 13, delete "least;" and insert -- at least; --, therefor.

In Column 14, Line 67, in Claim 20, delete "least;" and insert -- at least; --, therefor.

In Column 16, Line 4, in Claim 20, delete "least;" and insert -- at least; --, therefor.

Signed and Sealed this
Twenty-fourth Day of March, 2020

Andrei Iancu
*Director of the United States Patent and Trademark Office*